(12) United States Patent
Chang

(10) Patent No.: US 8,417,193 B2
(45) Date of Patent: Apr. 9, 2013

(54) TRANSMITTING DEVICE AND METHOD FOR DETERMINING TARGET PREDISTORTION SETTING VALUE

(75) Inventor: Yuan-Shuo Chang, Taoyuan County (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 305 days.

(21) Appl. No.: 12/794,787

(22) Filed: Jun. 7, 2010

(65) Prior Publication Data

US 2010/0311351 A1    Dec. 9, 2010

Related U.S. Application Data

(60) Provisional application No. 61/184,831, filed on Jun. 7, 2009.

(51) Int. Cl.
*H04B 1/38* (2006.01)

(52) U.S. Cl. ..................................... 455/114.3; 375/296

(58) Field of Classification Search ................. 455/63.1, 455/67.11, 67.13, 114.1, 114.3, 115.1, 118, 455/126; 375/295, 296
See application file for complete search history.

(56) References Cited

U.S. PATENT DOCUMENTS

| 7,715,810 | B2 * | 5/2010 | Brobston | 455/114.2 |
| 2003/0104794 | A1 * | 6/2003 | Yang et al. | 455/118 |
| 2005/0009479 | A1 * | 1/2005 | Braithwaite | 455/114.3 |
| 2011/0051785 | A1 * | 3/2011 | Kenington et al. | 455/115.1 |

OTHER PUBLICATIONS

S.P.Stapleton, G.S.Kandola and J.K. Cavers, "Simulation and Analysis of an Adaptive Predistorter Utilizing a Complex Spectral Convolution", IEEE Transactions on Vehicular Technology, vol. 41, No. 4, pp. 387-394, Nov. 1992.

* cited by examiner

*Primary Examiner* — Thanh Le
(74) *Attorney, Agent, or Firm* — Winston Hsu; Scott Margo

(57) ABSTRACT

The present invention provides a transmitting device and a method for determining a target predistortion setting value. The transmitting device comprises: a setting value control unit, a predistortion unit, a transmitting circuit, a receiving circuit, and a determining unit. The present invention can predistort signals before a power amplifier in a transmitting device by a method of determining a target predistortion setting value (i.e. an optimal predistortion setting value) from a plurality of candidate predistortion setting values. In this way, signals outputted by the power amplifier in the transmitting device can be adjusted to an optimal state, so as to solve the distortion problem of the outputted signals of the power amplifier.

15 Claims, 8 Drawing Sheets

TRANSMITTING DEVICE AND METHOD FOR DETERMINING TARGET PREDISTORTION SETTING VALUE

CROSS REFERENCE TO RELATED APPLICATIONS

This application claims the priority of U.S. Provisional Application No. 61/184,831, filed on Jun. 7, 2009, which is included herein by reference in its entirety.

BACKGROUND OF THE INVENTION

1. Field of the Invention

The present invention relates to a transmitting device, and more particularly, to a transmitting device capable of solving distortion problems of output signals of a power amplifier and a method capable of determining a target predistortion setting value (i.e. an optimal predistortion setting value) from a plurality of candidate predistortion setting values, so as to solve the above problem.

2. Description of the Prior Art

In a wireless communication system, a transmitting device generally has a power amplifier at an output terminal to amplify a signal which is going to be transmitted and output the amplified signal. However, the power amplifier has a worse linearity when a larger power is inputted, and thus the amplified output signal has a distortion problem. In a prior art, a predistortion unit is positioned in a front stage of the power amplifier to compensate a non-linear effect of the power amplifier. Please refer to FIG. 1. FIG. 1 is a diagram showing characteristic curves of a predistortion unit 102, a power amplifier 104, and the amplitude/amplitude (AM/AM) characteristic curves thereof. As shown in FIG. 1, the linearity between an input signal power Pin and an output signal power Pout of the power amplifier 104 is better, and the data correctness of the output signal of the power amplifier 104 can be improved. In general, the predistortion unit and related method utilized to solve the distortion problem of the power amplifier of the transmitting device in the prior art requires complicated algorithms and high cost. Therefore, how to provide a transmitting device comprising a predistortion unit which is simple, efficient, and has lower cost and related method becomes an important issue.

SUMMARY OF THE INVENTION

It is therefore one of the objectives of the present invention to provide a transmitting device capable of predistorting output signals and a method for determining a target predistortion setting value, so as to solve the above problem.

The present invention discloses a transmitting device. The transmitting device comprises: a setting value control unit, a predistortion unit, a transmitting circuit, a receiving circuit, and a determining unit. The setting value control unit is utilized for providing a plurality of candidate predistortion setting values F1, F2, ..., Fn. The predistortion unit is coupled to the setting value control unit, and utilized for performing a plurality of predistortion operations on an input signal according to each of the candidate predistortion setting values F1, F2, ..., Fn individually, to generate a plurality of predistortion input signals corresponding to the candidate predistortion setting values F1, F2, ..., Fn accordingly. The transmitting circuit is coupled to the predistortion unit, and utilized for processing the plurality of predistortion input signals to generate a plurality of output signals. The receiving circuit is coupled to the transmitting circuit, and utilized for receiving the plurality of output signals to generate a plurality of receiving signals. The determining unit is coupled to the receiving circuit and the setting value control unit, and utilized for determining a target predistortion setting value from the candidate predistortion setting values F1, F2, ..., Fn according to the plurality of receiving signals to the setting value control unit.

Briefly summarized, the present invention can predistort signals before a power amplifier in a transmitting device by a method of determining a target predistortion setting value (i.e. an optimal predistortion setting value) from a plurality of candidate predistortion setting values. In this way, signals outputted by the power amplifier in the transmitting device can be adjusted to an optimal state, so as to solve the distortion problem of the outputted signals of the power amplifier.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
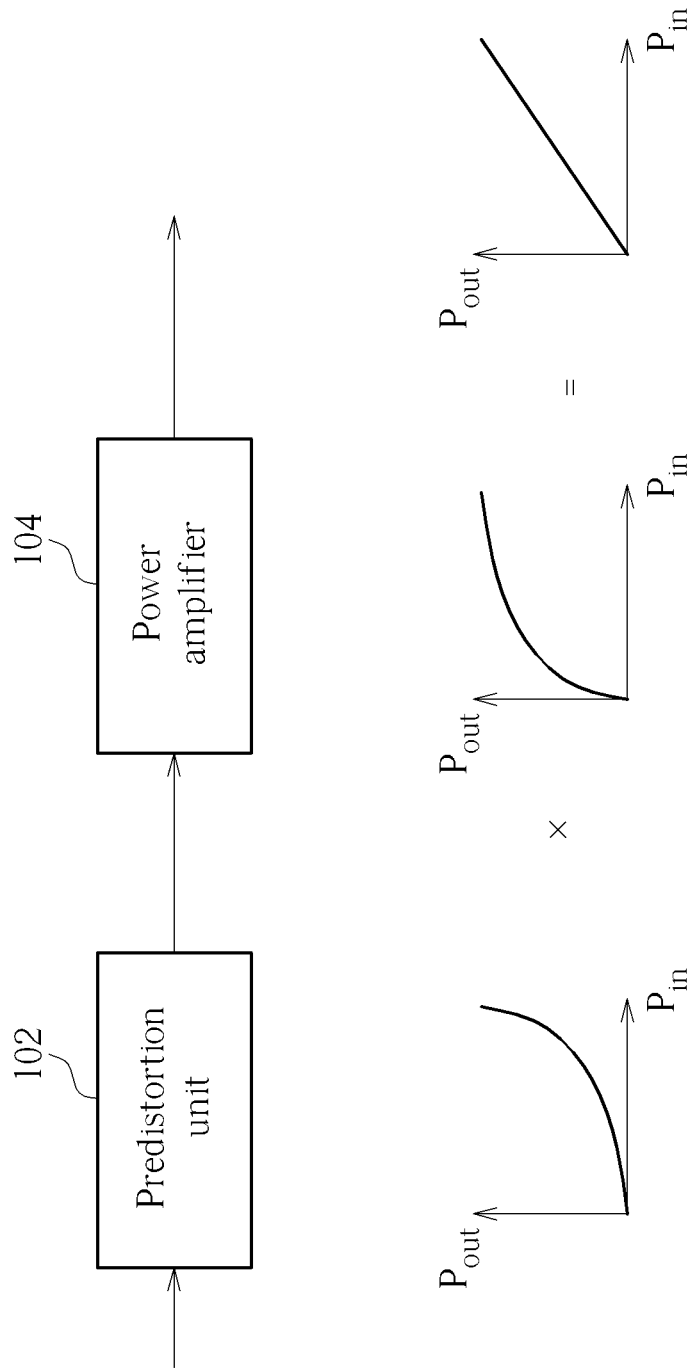
FIG. 1 is a diagram showing characteristic curves of a predistortion unit, a power amplifier, and the amplitude/amplitude (AM/AM) characteristic curves thereof.
Figure 2:
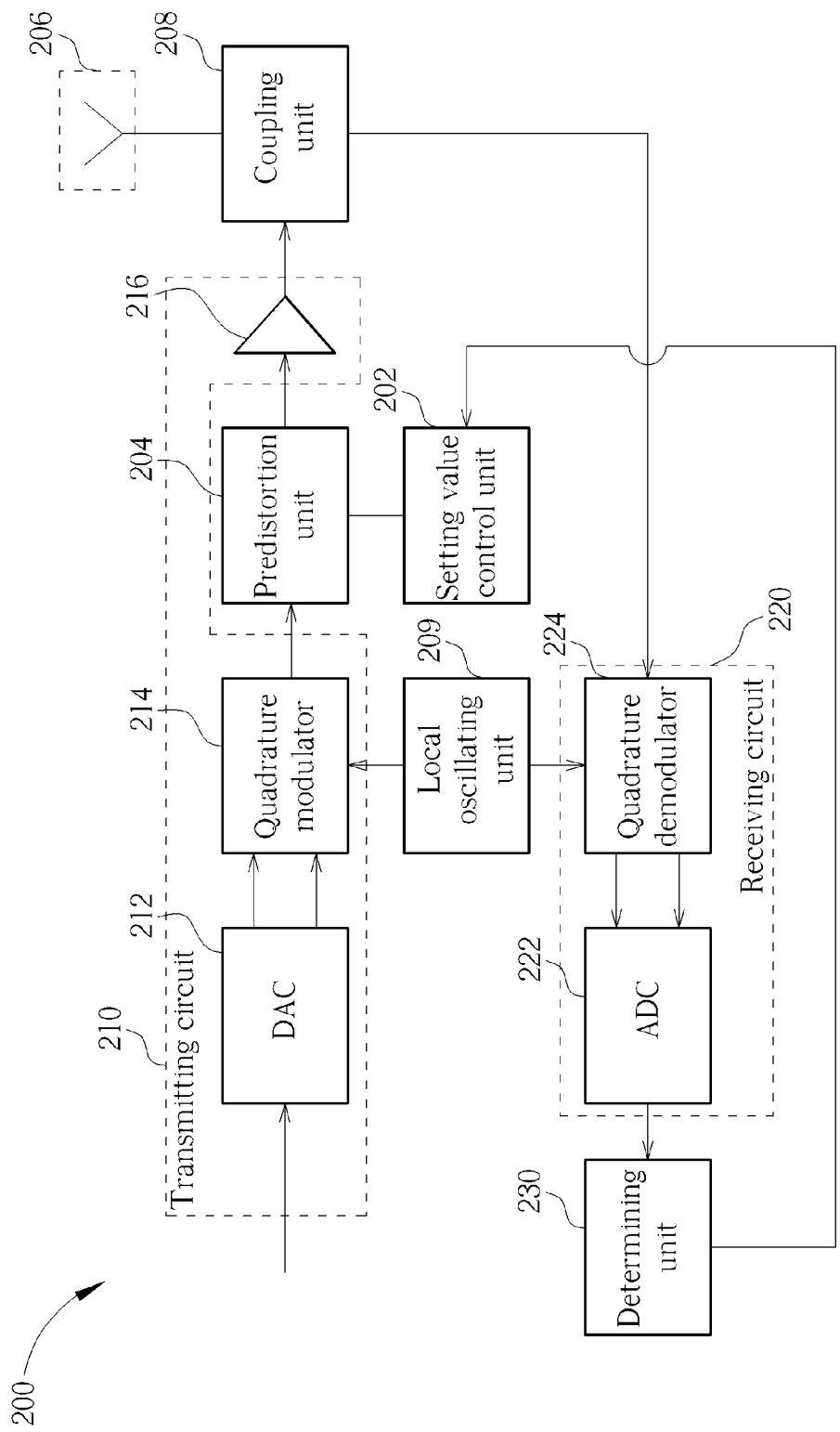
FIG. 2 shows a simplified block diagram of a transmitting device according to a first embodiment of the present invention.

Please refer to FIG. 2. FIG. 2 shows a simplified block diagram of a transmitting device 200 according to a first embodiment of the present invention. As shown in FIG. 2, the transmitting device 200 comprises: a setting value control unit 202, a predistortion unit 204, an antenna unit 206, a coupling unit 208, a local oscillating unit 209, a transmitting circuit 210, a receiving circuit 220, and a determining unit 230, wherein the transmitting circuit 210 comprises a DAC 212, a quadrature modulator 214, and a power amplifier 216, and the receiving circuit 220 comprises an ADC 222 and a quadrature demodulator 224. In addition, the quadrature modulator 214 comprises two multipliers (not shown), a ninety-degree phase shifter (not shown), and an adder (not shown). Please note that the operational details and configuration details related to the antenna unit 206, the coupling unit 208, the local oscillating unit 209, the DAC 212, the quadrature modulator 214, the ADC 222, the quadrature demodulator 224, and the power amplifier 216 are all well known to those of average skill in this art, and thus further explanation of the details and operations of these elements are omitted herein for the sake of brevity.

The setting value control unit 202 is utilized for providing a plurality of candidate predistortion setting values F1, F2, ..., Fn. The predistortion unit 204 is coupled to the setting value control unit 202, and utilized for performing a plurality of predistortion operations on an input signal according to each of the candidate predistortion setting values F1, F2, ..., Fn individually, to generate a plurality of predistortion input signals corresponding to the candidate predistortion setting values F1, F2, ..., Fn accordingly. The transmitting circuit 210 is coupled to the predistortion unit 204, and the power amplifier 216 of the transmitting circuit 210 is utilized for processing the plurality of predistortion input signals to generate a plurality of output signals. The receiving circuit 220 is coupled to the transmitting circuit 210, and utilized for receiving the plurality of output signals to generate a plurality of receiving signals. The determining unit 230 is coupled to the receiving circuit 220 and the setting value control unit 202, and utilized for determining a target predistortion setting value from the candidate predistortion setting values F1, F2, ..., Fn according to the plurality of receiving signals to the setting value control unit 202, wherein the determining unit 230 calculates a characteristic value corresponding to the plurality of receiving signals corresponding to each candidate predistortion setting value, and determines an extreme value of a plurality of characteristic values respectively corresponding to the candidate predistortion setting values F1, F2, ..., Fn, and utilizes a candidate predistortion setting value corresponding to the extreme value as the target predistortion setting value. In this way, the signals outputted by the power amplifier 216 in the transmitting device 200 can be adjusted to an optimal state, so as to solve the distortion problem of the outputted signals of the power amplifier 216. In addition, please note that the above embodiment is only for an illustrative purpose and is not meant to be a limitation of the present invention.

Figure 3:
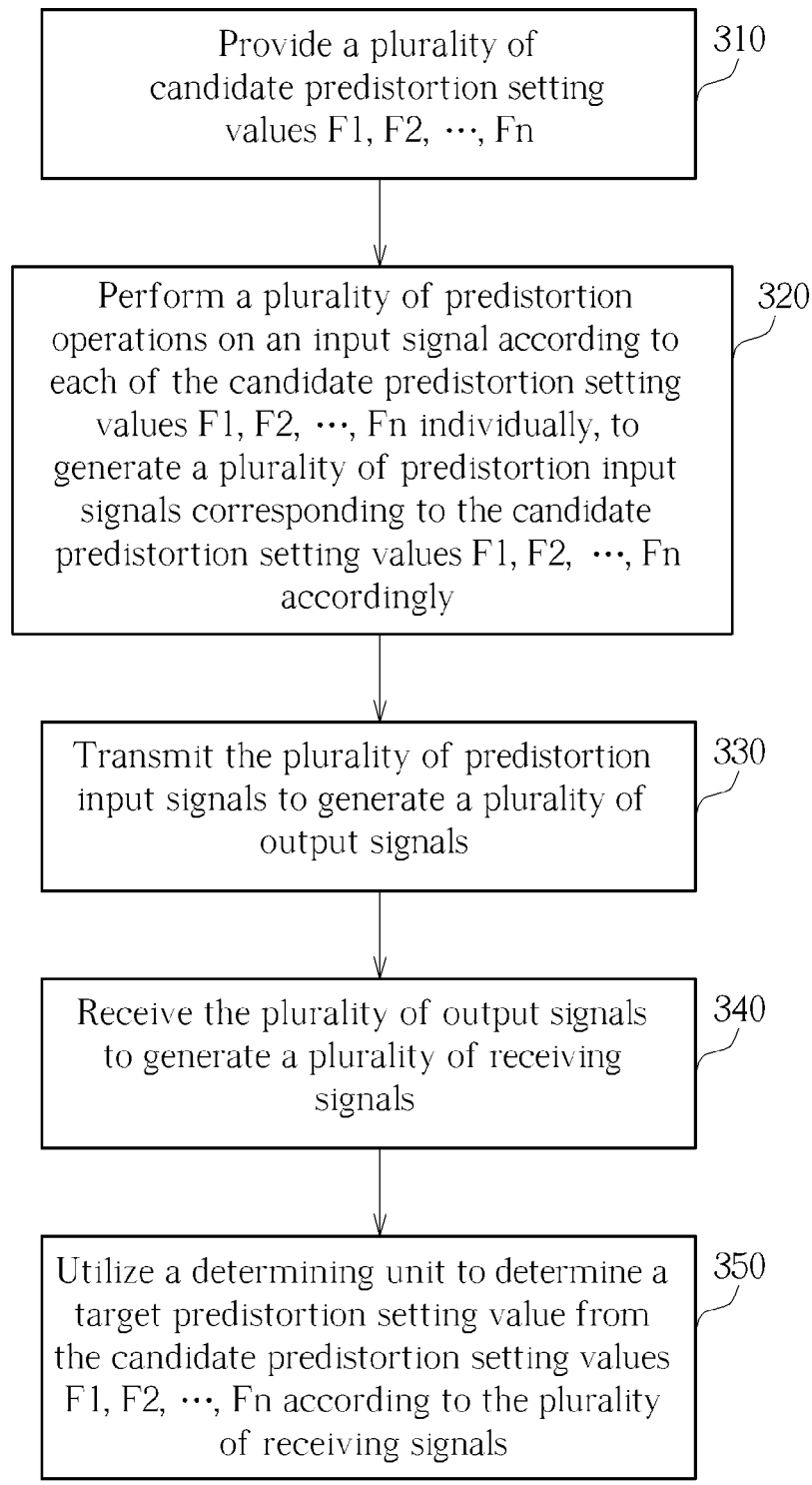
FIG. 3 is a flowchart illustrating a method of determining a target predistortion setting value employed for the transmitting device in the first embodiment of the present invention.

Please refer to FIG. 3. FIG. 3 is a flowchart illustrating a method of determining a target predistortion setting value employed for the transmitting device 200 in the first embodiment of the present invention, which comprises the Steps 310~350. The Step 350 can further comprise: utilizing the determining unit to calculate a characteristic value corresponding to the plurality of receiving signals corresponding to each candidate predistortion setting value; determining an extreme value of a plurality of characteristic values respectively corresponding to the candidate predistortion setting values F1, F2, ..., Fn; and utilizing a candidate predistortion setting value corresponding to the extreme value as the target predistortion setting value.

Figure 4:
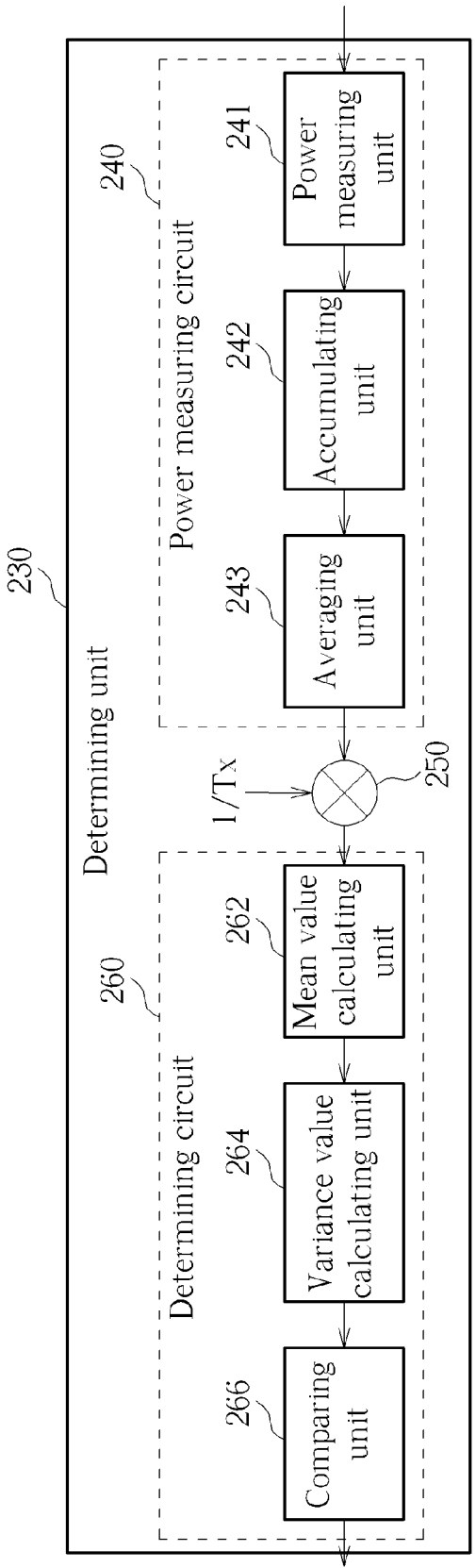
FIG. 4 shows a simplified block diagram of a determining unit in a transmitting device according to a second embodiment of the present invention.

Please refer to FIG. 4. FIG. 4 shows a simplified block diagram of a determining unit 230 in a transmitting device 200 according to a second embodiment of the present invention. As shown in FIG. 4, the determining unit 230 comprises: a power measuring circuit 240, a multiplying circuit 250, and a determining circuit 260. The power measuring circuit 240 is utilized for measuring a power estimation value of each receiving signal of the plurality of receiving signals. The multiplying circuit 250 is coupled to the power measuring circuit 240, and utilized for multiplying the power estimation value of each receiving signal of the plurality of receiving signals with an inverse value of a transmitting power value (such as 1/Tx shown in FIG. 4) corresponding to the receiving signal, to generate a plurality of power gain values respectively corresponding to the plurality of receiving signals. The determining circuit 260 is coupled to the multiplying circuit 250, and utilized for determining the plurality of characteristic values respectively corresponding to the candidate predistortion setting values F1, F2, ..., Fn according to the plurality of power gain values, and utilizing a candidate predistortion setting value corresponding to the extreme value as the target predistortion setting value.

In this embodiment, each receiving signal of the plurality of receiving signals comprises a plurality of sampling values, and the characteristic value corresponding to each candidate predistortion setting value is a variance value, and the extreme value is a minimum variance value of a plurality of variance values respectively corresponding to the candidate predistortion setting values F1, F2, ..., Fn. In addition, the power measuring circuit 240 comprises: a power measuring unit 241, an accumulating unit 242, and an averaging unit 243, and the determining circuit 260 comprises: a mean value calculating unit 262, a variance value calculating unit 264, and a comparing unit 266. The power measuring unit 241 is utilized for generating a plurality of power values for the plurality of sampling values of each receiving signal. The accumulating unit 242 is coupled to the power measuring unit 241, and utilized for accumulating the plurality of power values of each receiving signal, to generate an accumulated power values correspondingly. The averaging unit 243 is coupled to the accumulating circuit 242, and utilized for generating an average power value according to a number of the plurality of sampling values of each receiving signal and the accumulated power values of each receiving signal as the power estimation value of each receiving signal. After the multiplying circuit 250 multiplies the power estimation value of each receiving signal of the plurality of receiving signals with an inverse value of a transmitting power value corresponding to the receiving signal, a plurality of power gain values respectively corresponding to the plurality of receiving signals can be obtained accordingly, i.e. a plurality of data points in one of the power gain curves shown in FIG. 6 (the data points are represented by the asterisks). In addition, please note that the data points of each power gain curve shown in FIG. 6 represent square values of actual gain values of the power amplifier 216 of the transmitting device 200.

Next, the mean value calculating unit 262 is utilized for calculating a mean value of the plurality of power gain values of the plurality of receiving signals corresponding to each candidate predistortion setting value. The variance value calculating unit 264 is coupled to the mean value calculating unit 262, and utilized for calculating the corresponding variance value according to the mean value and the plurality of power gain values of the plurality of receiving signals corresponding to each candidate predistortion setting value. The comparing unit 266 is coupled to the variance value calculating circuit 264, and utilized for comparing the mean values respectively corresponding to the candidate predistortion setting values F1, F2, ..., Fn to determine the minimum variance value, and utilizing the candidate predistortion setting value corresponding to the minimum variance value as the target predistortion setting value. In other words, the mean value calculating unit 262, the variance value calculating unit 264, and the comparing unit 266 select a most linear power gain curve in FIG. 6 by searching the minimum variance value, and utilize the candidate predistortion setting value corresponding to most linear power gain curve as the target predistortion setting value.

Figure 5:
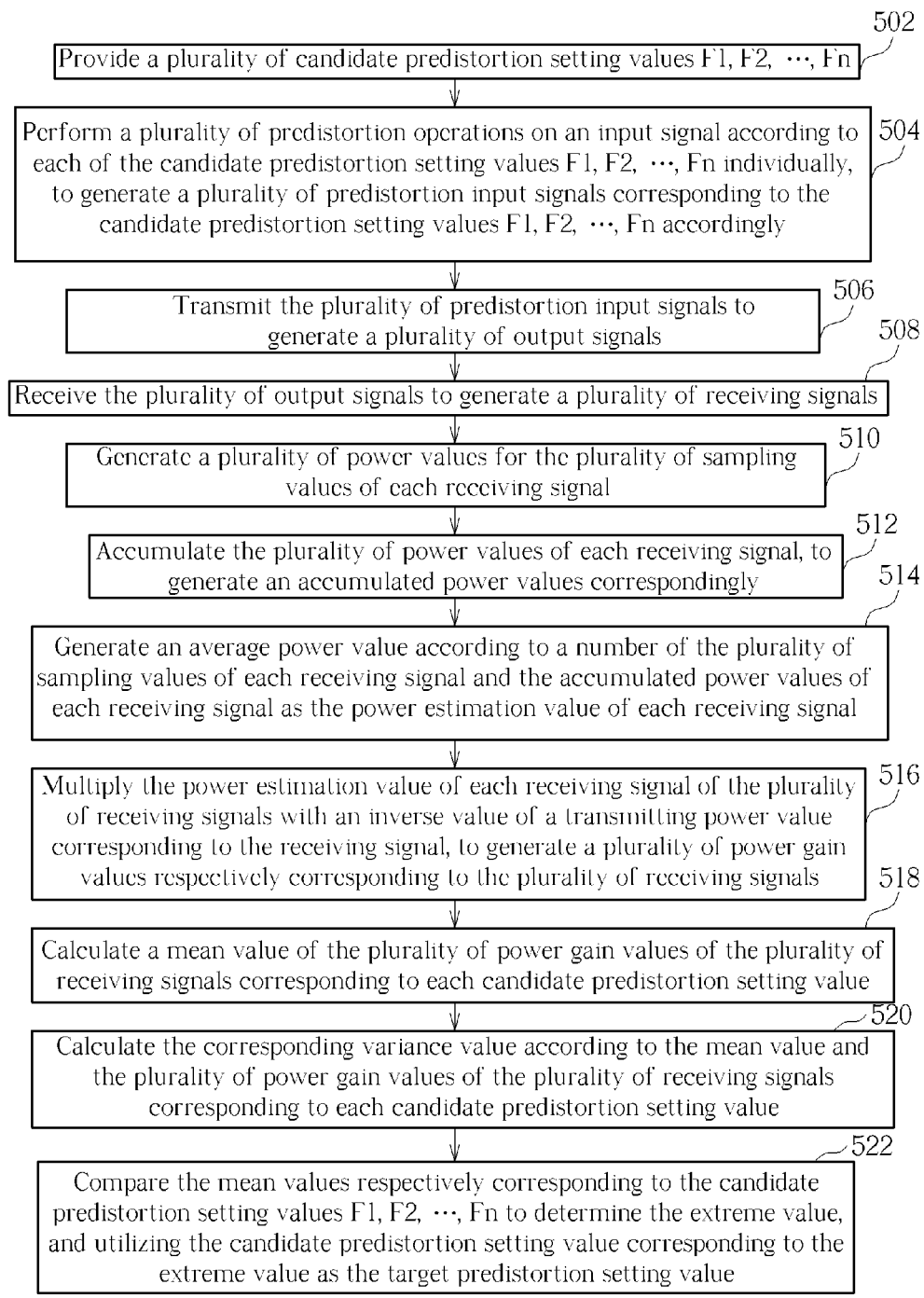
FIG. 5 is a flowchart illustrating a method of determining a target predistortion setting value employed for the transmitting device in the second embodiment of the present invention.

Please refer to FIG. 5. FIG. 5 is a flowchart illustrating a method of determining a target predistortion setting value employed for the transmitting device 200 in the second embodiment of the present invention, which comprises the Steps 50~2522.

Figure 6:
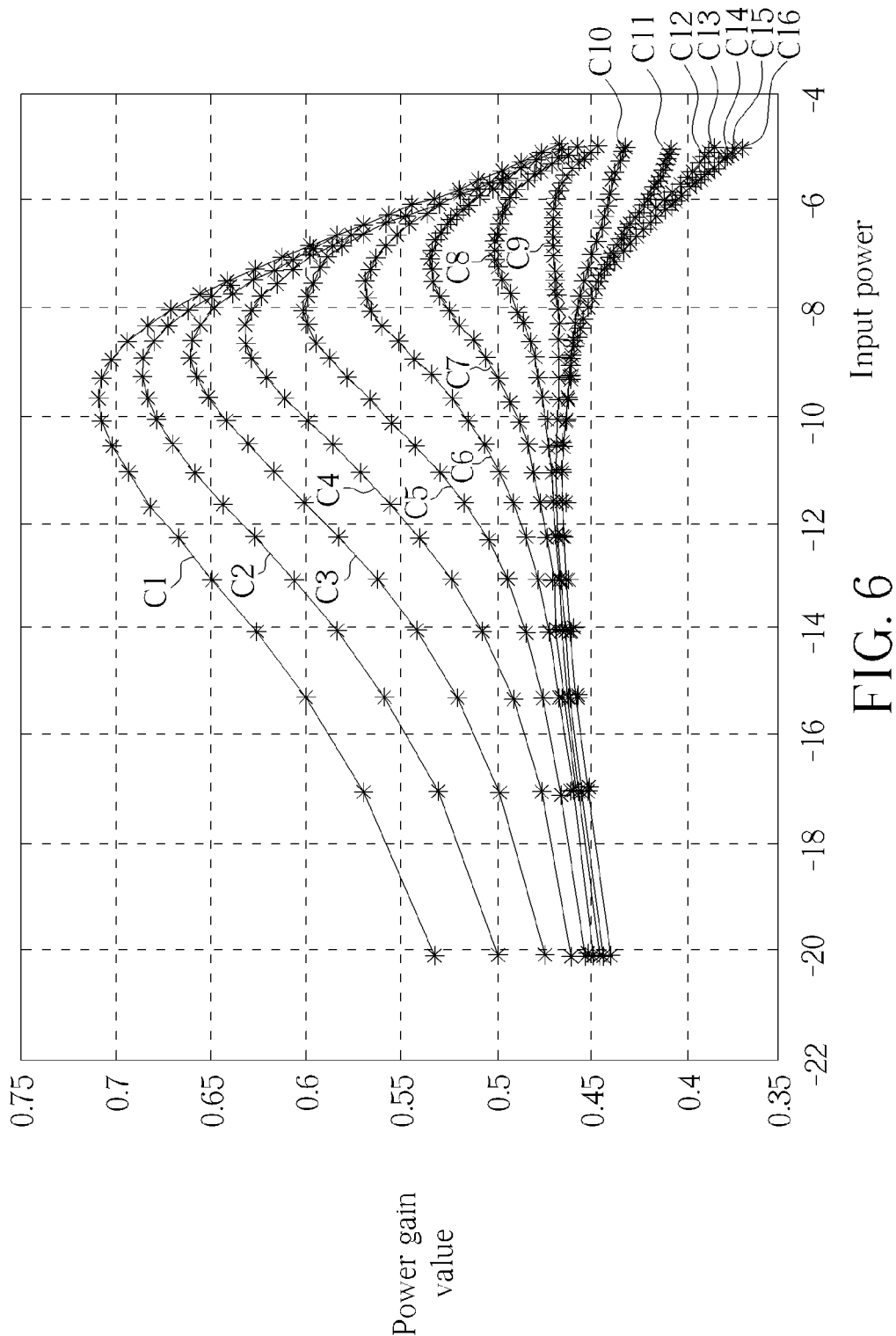
FIG. 6 shows a simulation result of the present invention.

For example, please refer to FIG. 6. FIG. 6 shows a simulation result of the present invention. As shown in FIG. 6, sixteen candidate predistortion setting values F1, F2, F3, F4, F5, F6, F7, F8, F9, F10, F11, F12, F13, F14, F15, F16 are corresponding to sixteen AM/AM power gain curves C1, C2, C3, C4, C5, C6, C7, C8, C9, C10, C11, C12, C13, C14, C15, C16, wherein each power gain curve is composed of corresponding power gain values generated by the method of determining a target predistortion setting value of the present invention. Thus, the candidate predistortion setting value corresponding to the minimum variance value will be corresponding to the most linear power gain curve. In other words, the method of determining a target predistortion setting value of the present invention is selecting the most linear power gain curve, and utilizing the candidate predistortion setting value (such as F9 in FIG. 6) corresponding to most linear power gain curve (such as C9 in FIG. 6) as the target predistortion setting value. In this way, signals outputted by the power amplifier 216 in the transmitting device 200 can be adjusted to an optimal state, so as to solve the distortion problem of the outputted signals of the power amplifier 216.

Figure 7:
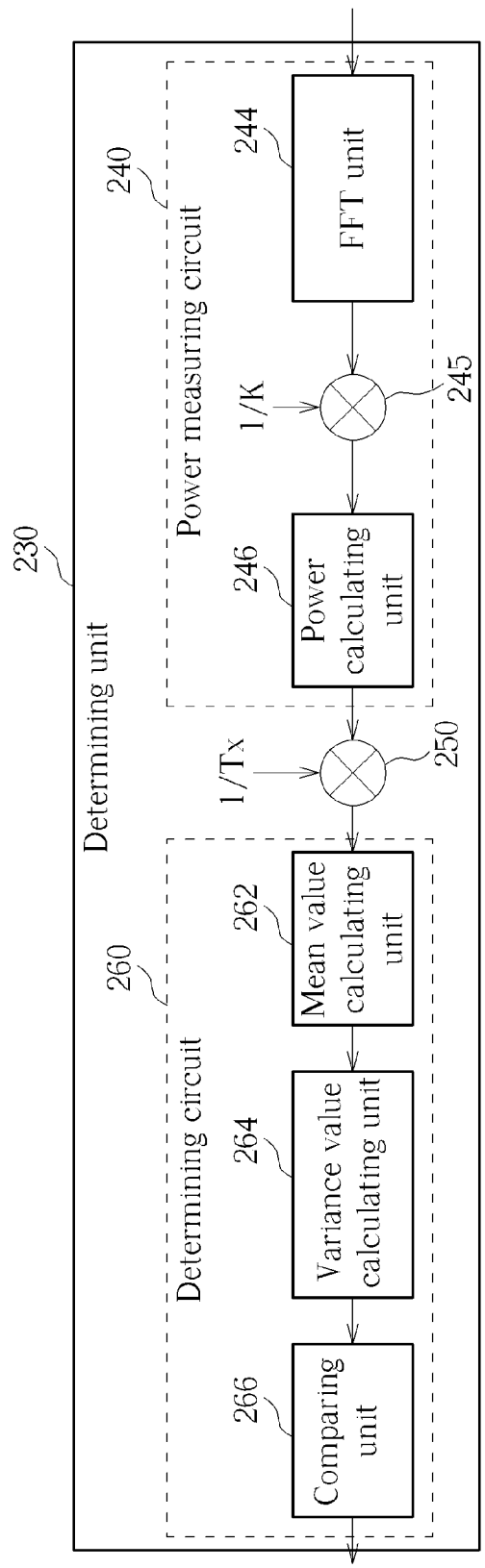
FIG. 7 shows a simplified block diagram of a determining unit in a transmitting device according to a third embodiment of the present invention.

Please refer to FIG. 7. FIG. 7 shows a simplified block diagram of a determining unit 230 in a transmitting device 200 according to a third embodiment of the present invention. As shown in FIG. 4, the determining unit 230 comprises: a power measuring circuit 240, a multiplying circuit 250, and a determining circuit 260. The power measuring circuit 240 is utilized for measuring a power estimation value of each receiving signal of the plurality of receiving signals. The functions and operation schemes of the multiplying circuit 250 and the determining circuit 260 are the same as those in the second embodiment of the present invention, and thus further explanation of the details and operations of these elements are omitted herein for the sake of brevity. The difference between the third embodiment and the second embodiment of the present invention is that the second embodiment measures the power estimation value according to a time domain scheme, and the third embodiment measures the power estimation value according to a frequency domain scheme.

In this embodiment, each receiving signal of the plurality of receiving signals comprises a plurality of sampling values, and the characteristic value corresponding to each candidate predistortion setting value is a variance value, and the extreme value is a minimum variance value of a plurality of variance values respectively corresponding to the candidate predistortion setting values F1, F2, . . . , Fn. In addition, the power measuring circuit 240 comprises: a Fast Fourier Transforming (FFT) unit 244, a multiplying unit 245, and a power calculating unit 246, and the determining circuit 260 comprises: a mean value calculating unit 262, a variance value calculating unit 264, and a comparing unit 266. The FFT unit 244 is utilized for performing an FFT operation for the plurality of sampling values of each receiving signal to generate a first output value correspondingly. The multiplying unit 245 is coupled to the FFT unit 244, and utilized for multiplying the first output value of each receiving signal with an inverse value of a number of the plurality of sampling values (such as 1/K shown in FIG. 7), to generate a second output value correspondingly. The power calculating unit 246 is coupled to the multiplying unit 245, and utilized for generating a power value according to the second output value of each receiving signal as the power estimation value of each receiving signal. Next, similar with the operational description in the second embodiment, the multiplying circuit 250 and the determining circuit 260 select a most linear power gain curve in FIG. 6 by searching the minimum variance value, and utilize the candidate predistortion setting value corresponding to most linear power gain curve as the target predistortion setting value.

Figure 8:
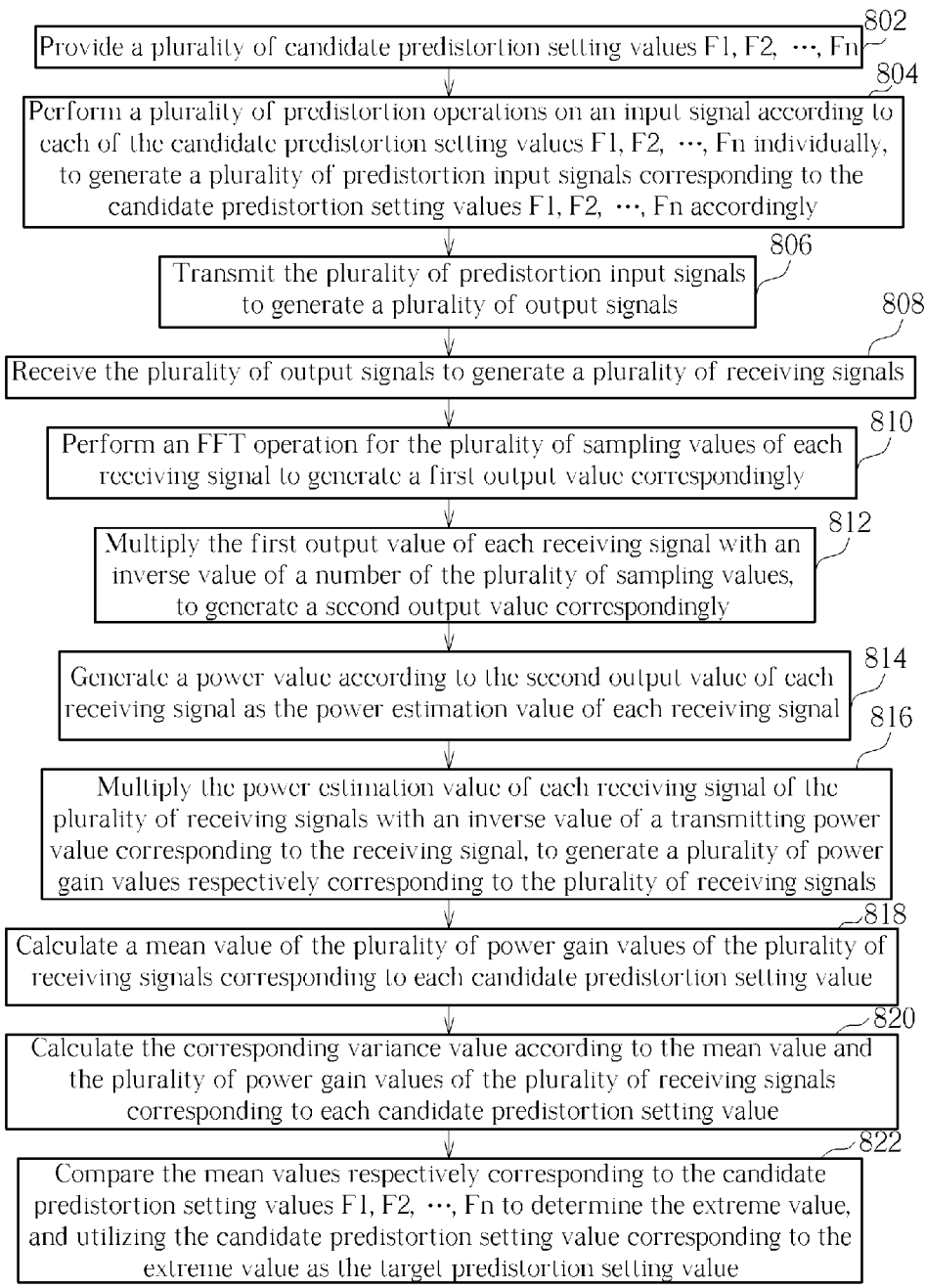
FIG. 8 is a flowchart illustrating a method of determining a target predistortion setting value employed for the transmitting device in the third embodiment of the present invention.

Please refer to FIG. 8. FIG. 8 is a flowchart illustrating a method of determining a target predistortion setting value employed for the transmitting device 200 in the third embodiment of the present invention, which comprises the Steps 802~822.

Briefly summarized, the present invention can predistort signals before a power amplifier in a transmitting device by a method of determining a target predistortion setting value (i.e. an optimal predistortion setting value) from a plurality of candidate predistortion setting values. In this way, signals outputted by the power amplifier in the transmitting device can be adjusted to an optimal state, so as to solve the distortion problem of the outputted signals of the power amplifier.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transmitting device, comprising:
   a setting value control unit, for providing a plurality of candidate predistortion setting values;
   a predistortion unit, coupled to the setting value control unit, for performing a plurality of predistortion operations on an input signal according to each of the plurality of candidate predistortion setting values individually, to generate a plurality of predistortion input signals corresponding to the plurality of candidate predistortion setting values accordingly;
   a transmitting circuit, coupled to the predistortion unit, for processing the plurality of predistortion input signals to generate a plurality of output signals;
   a receiving circuit, coupled to the transmitting circuit, for receiving the plurality of output signals to generate a plurality of receiving signals; and
   a determining unit, coupled to the receiving circuit and the setting value control unit, for determining a target predistortion setting value from the plurality of candidate predistortion setting values according to the plurality of receiving signals to the setting value control unit.

2. The transmitting device of claim 1, wherein the determining unit calculates a characteristic value corresponding to the plurality of receiving signals corresponding to each candidate predistortion setting value, and determines an extreme value of a plurality of characteristic values respectively corresponding to the plurality of candidate predistortion setting values, and utilizes a candidate predistortion setting value corresponding to the extreme value as the target predistortion setting value.

3. The transmitting device of claim 2, wherein the determining unit comprises:
   a power measuring circuit, for measuring a power estimation value of each receiving signal of the plurality of receiving signals;
   a multiplying circuit, coupled to the power measuring circuit, for multiplying the power estimation value of each receiving signal of the plurality of receiving signals with an inverse value of a transmitting power value corresponding to the receiving signal, to generate a plurality of power gain values respectively corresponding to the plurality of receiving signals accordingly; and
   a determining circuit, coupled to the multiplying circuit, for determining the plurality of characteristic values respectively corresponding to the plurality of candidate predistortion setting values according to the plurality of power gain values, and utilizing the candidate predistortion setting value corresponding to the extreme value as the target predistortion setting value.

4. The transmitting device of claim 3, wherein the power measuring circuit measures the power estimation value according to a time domain scheme.

5. The transmitting device of claim 3, wherein the power measuring circuit measures the power estimation value according to a frequency domain scheme.

6. The transmitting device of claim 3, wherein each receiving signal of the plurality of receiving signals comprises a plurality of sampling values, and the power measuring circuit comprises:
- a power measuring unit, for generating a plurality of power values for the plurality of sampling values of each receiving signal;
- an accumulating unit, coupled to the power measuring unit, for accumulating the plurality of power values of each receiving signal, to generate an accumulated power values correspondingly; and
- an averaging unit, coupled to the accumulating circuit, for generating an average power value according to a number of the plurality of sampling values of each receiving signal and the accumulated power values of each receiving signal as the power estimation value of each receiving signal.

7. The transmitting device of claim 3, wherein each receiving signal of the plurality of receiving signals comprises a plurality of sampling values, and the power measuring circuit comprises:
- a Fast Fourier Transforming (FFT) unit, for performing an FFT operation for the plurality of sampling values of each receiving signal to generate a first output value correspondingly;
- a multiplying unit, coupled to the FFT unit, for multiplying the first output value of each receiving signal with an inverse value of a number of the plurality of sampling values, to generate a second output value correspondingly; and
- a power calculating unit, coupled to the multiplying unit, for generating a power value according to the second output value of each receiving signal as the power estimation value of each receiving signal.

8. The transmitting device of claim 3, wherein the characteristic value corresponding to each candidate predistortion setting value is a variance value, the extreme value is a minimum variance value of a plurality of variance values respectively corresponding to the plurality of candidate predistortion setting values, and the determining circuit comprises:
- a mean value calculating unit, for calculating a mean value of the plurality of power gain values of the plurality of receiving signals corresponding to each candidate predistortion setting value;
- a variance value calculating unit, coupled to the mean value calculating unit, for calculating the corresponding variance value according to the mean value and the plurality of power gain values of the plurality of receiving signals corresponding to each candidate predistortion setting value; and
- a comparing unit, coupled to the variance value calculating circuit, for comparing the plurality of variance values respectively corresponding to the plurality of candidate predistortion setting values to determine the extreme value, and utilizing the candidate predistortion setting value corresponding to the extreme value as the target predistortion setting value.

9. A method for determining a target predistortion setting value and applied to a transmitting device, the method comprising:
- providing a plurality of candidate predistortion setting values;
- performing a plurality of predistortion operations on an input signal according to each of the plurality of candidate predistortion setting values individually, to generate a plurality of predistortion input signals corresponding to the plurality of candidate predistortion setting values accordingly;
- transmitting the plurality of predistortion input signals to generate a plurality of output signals;
- receiving the plurality of output signals to generate a plurality of receiving signals; and
- utilizing a determining unit to determine a target predistortion setting value from the plurality of candidate predistortion setting values according to the plurality of receiving signals.

10. The method of claim 9, wherein the step of utilizing the determining unit to determine the target predistortion setting value from the plurality of candidate predistortion setting values according to the plurality of receiving signals comprises:
- utilizing the determining unit to calculate a characteristic value corresponding to the plurality of receiving signals corresponding to each candidate predistortion setting value;
- determining an extreme value of a plurality of characteristic values respectively corresponding to the plurality of candidate predistortion setting values; and
- utilizing a candidate predistortion setting value corresponding to the extreme value as the target predistortion setting value.

11. The method of claim 10, wherein the characteristic value corresponding to each candidate predistortion setting value is a variance value, the extreme value is a minimum variance value of a plurality of variance values respectively corresponding to the plurality of candidate predistortion setting values, and the step of determining an extreme value of a plurality of characteristic values respectively corresponding to the plurality of candidate predistortion setting values comprises:
- comparing the mean values respectively corresponding to the plurality of candidate predistortion setting values to determine the extreme value, and utilizing the candidate predistortion setting value corresponding to the extreme value as the target predistortion setting value.

12. The method of claim 10, wherein the step of utilizing the determining unit to calculate a characteristic value corresponding to the plurality of receiving signals corresponding to each candidate predistortion setting value comprises:
- measuring a power estimation value of each receiving signal of the plurality of receiving signals;
- multiplying the power estimation value of each receiving signal of the plurality of receiving signals with an inverse value of a transmitting power value corresponding to the receiving signal, to generate a plurality of power gain values respectively corresponding to the plurality of receiving signals; and
- determining the plurality of characteristic values respectively corresponding to the plurality of candidate predistortion setting values according to the plurality of power gain values.

13. The method of claim 12, wherein each receiving signal of the plurality of receiving signals comprises a plurality of sampling values, and the step of measuring the power estimation value of each receiving signal of the plurality of receiving signals comprises:

generating a plurality of power values for the plurality of sampling values of each receiving signal;

accumulating the plurality of power values of each receiving signal, to generate an accumulated power values correspondingly; and generating an average power value according to a number of the plurality of sampling values of each receiving signal and the accumulated power values of each receiving signal as the power estimation value of each receiving signal.

14. The method of claim 12, wherein each receiving signal of the plurality of receiving signals comprises a plurality of sampling values, and the step of measuring the power estimation value of each receiving signal of the plurality of receiving signals comprises:

performing an Fast Fourier Transforming (FFT) operation for the plurality of sampling values of each receiving signal to generate a first output value correspondingly;

multiplying the first output value of each receiving signal with an inverse value of a number of the plurality of sampling values, to generate a second output value correspondingly; and generating a power value according to the second output value of each receiving signal as the power estimation value of each receiving signal.

15. The method of claim 12, wherein the characteristic value corresponding to each candidate predistortion setting value is a variance value, the extreme value is a minimum variance value of a plurality of variance values respectively corresponding to the plurality of candidate predistortion setting values, and the step of determining the plurality of characteristic values respectively corresponding to the plurality of candidate predistortion setting values according to the plurality of power gain values comprises:

calculating a mean value of the plurality of power gain values of the plurality of receiving signals corresponding to each candidate predistortion setting value; and calculating the corresponding variance value according to the mean value and the plurality of power gain values of the plurality of receiving signals corresponding to each candidate predistortion setting value.

* * * * *